(12) United States Patent
Andrys et al.

(10) Patent No.: US 8,362,840 B2
(45) Date of Patent: *Jan. 29, 2013

(54) APPARATUS AND METHODS FOR BIASING A POWER AMPLIFIER

(75) Inventors: Paul Raymond Andrys, Swisher, IA (US); David Steven Ripley, Marion, IA (US); Terrence John Shie, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/423,952

(22) Filed: Mar. 19, 2012

(65) Prior Publication Data

US 2012/0178384 A1 Jul. 12, 2012

Related U.S. Application Data

(63) Continuation of application No. 12/792,764, filed on Jun. 3, 2010, now Pat. No. 8,154,345.

(51) Int. Cl.
*H03F 1/52* (2006.01)
(52) U.S. Cl. .................. 330/298; 330/279; 330/289
(58) Field of Classification Search .......... 330/297–298, 330/279, 289, 290, 266, 272
See application file for complete search history.

(56) References Cited

U.S. PATENT DOCUMENTS

| 4,945,445 | A | 7/1990 | Schmerda et al. |
| 6,150,714 | A | 11/2000 | Andreycak et al. |
| 6,424,035 | B1 | 7/2002 | Sapp et al. |
| 7,515,000 | B1 | 4/2009 | Jin et al. |
| 2009/0102493 | A1 | 4/2009 | Disney et al. |

FOREIGN PATENT DOCUMENTS

WO WO 2011/152921 12/2011

OTHER PUBLICATIONS

International Search Report in PCT/US2011/030501 (WO 2011/152921), dated Feb. 20, 2012.
Written Opinion of the International Searching Authority in PCT/US2011/030501 (WO 2011/152921), dated Feb. 20, 2012.

*Primary Examiner* — Hieu Nguyen
(74) *Attorney, Agent, or Firm* — Knobbe Martens Olson & Bear LLP

(57) ABSTRACT

Apparatus and methods for biasing a power amplifier are provided. In one embodiment, a packaged circuit includes a power amplifier, a bond wire electrically connected between a system voltage source and a supply input of the power amplifier, a current source, a reference resistor electrically connected between the system voltage source and the current source, and a comparator. The comparator is configured to compare a sense voltage that is based on a voltage across the bond wire to a reference voltage that is based on a voltage across the reference resistor. The comparator is configured to generate a saturation control signal for clamping a bias current of the power amplifier when the sense voltage exceeds the reference voltage.

20 Claims, 6 Drawing Sheets

APPARATUS AND METHODS FOR BIASING A POWER AMPLIFIER

CROSS-REFERENCE TO RELATED APPLICATIONS

This application is a continuation of U.S. patent application Ser. No. 12/792,764, filed Jun. 3, 2010 entitled "APPARATUS AND METHOD FOR CURRENT SENSING USING A WIRE BOND", which is herein incorporated by reference in its entirety.

BACKGROUND

1. Field

Embodiments of the invention relate to power amplifiers.

2. Description of the Related Technology

Portable communication devices, such as cellular telephones, personal digital assistants (PDAs), WiFi transceivers, and other communication devices transmit and receive communication signal at various frequencies that correspond to different communication bands and at varying power levels. These devices are typically powered by a portable rechargeable power source, such as a direct current (DC) battery, and rely on a radio frequency (RF) power amplifier to transmit the communication signal. Under some conditions, an RF power amplifier (PA) will draw excessive current from the power supply, such as when subjected to non-optimal (high VSWR) antenna load conditions.

To restrict the current consumed by the power amplifier to remain below circuit destructive levels and to extend system battery life, a current limiting function is typically included in the design of the power amplifier. Integral to the current limiting function is a current sense device. For example, in a global system for mobile communication (GSM) cellular PA module application, the current sense function is typically performed by a specialized, low ohmic surface mount technology (SMT) resistor inserted in series with the PA collector bias inductor. The voltage developed across the SMT resistor is proportional to the PA current and is continuously compared to a reference voltage which represents the desired current limit threshold. Under high current conditions, the voltage across the resistor exceeds the reference voltage and the PA collector bias voltage is reduced to maintain the power amplifier current at the desired current limit threshold.

Unfortunately, the specialized SMT current sensing resistor is costly when compared to the cost of a typical resistor. The combined requirements of low resistance (on the order of 20 milliohm (mΩ)), tight tolerance (on the order of 5%), low temperature coefficient (thermal coefficient of resistance (TCR) on the order of 200 parts per million (ppm)), and low volume contribute to the high unit cost of the resistor.

Therefore, it would be desirable to maintain the effectiveness of the current sensing function, while reducing the cost of the associated components.

SUMMARY

In certain embodiments, the present disclosure relates to a packaged circuit. The packaged circuit includes a power amplifier configured to amplify a radio frequency (RF) signal, a first bond wire electrically connected between a system voltage source and a supply input of the power amplifier, a current source, a reference resistor electrically connected between the system voltage source and the current source, and a comparator. The comparator is configured to compare a sense voltage that is based on a voltage across the first bond wire to a reference voltage that is based on a voltage across the reference resistor. The comparator is further configured to generate a saturation control signal for clamping a bias current of the power amplifier when the sense voltage exceeds the reference voltage.

In some embodiments, the packaged circuit further includes a first die including the comparator.

In a number of embodiments, the first die further includes a bias circuit configured to generate the bias current of the power amplifier, the bias circuit configured to clamp a supply current flowing through the power amplifier at a current limit threshold when the saturation control signal indicates that the sense voltage exceeds the reference voltage.

According to several embodiments, the first die further includes a capacitor electrically connected between an output of the comparator and an input of the comparator configured to receive the sense voltage.

In some embodiments, the first die further includes the reference resistor and the current source.

In certain embodiments, the current source is configured to compensate the reference voltage for changes in resistance of the first bond wire due to changes in temperature.

In various embodiments, the packaged circuit further includes a second die including the power amplifier.

In some embodiments, the first die is implemented using a silicon (Si) process and the second die is implemented using a gallium arsenide (GaAs) process.

According to certain embodiments, the packaged circuit further includes a printed circuit board (PCB). The first and second dies are disposed on the PCB.

In a number of embodiments, the bond wire is electrically connected between a first connection of the PCB configured to receive the system voltage source and a second connection of the PCB.

In some embodiments, the packaged circuit further includes a choke inductor electrically connected between the second connection of the PCB and the supply input of the power amplifier.

In various embodiments, the packaged circuit further includes a second bond wire electrically connected in parallel with the first bond wire.

In certain embodiments, the present disclosure relates to a portable communications device. The portable communications device includes a transceiver, a power amplifier configured to amplify a signal generated from the transceiver, a power supply configured to generate a system voltage source, a bond wire electrically connected between the system voltage source and a supply input of the power amplifier, a current source, a reference resistor electrically connected between the system voltage source and the current source, and a comparator. The comparator is configured to compare a sense voltage that is based on a voltage across the bond wire to a reference voltage that is based on a voltage across the reference resistor. The comparator is further configured to generate a saturation control signal for clamping a bias current of the power amplifier when the sense voltage exceeds the reference voltage.

In a number of embodiments, the portable communications device further includes a bias circuit configured to generate the bias current of the power amplifier. The bias circuit is configured to clamp a supply current flowing through the power amplifier at a current limit threshold when the saturation control signal indicates that the sense voltage exceeds the reference voltage.

In some embodiments, the portable communications device further includes a capacitor electrically connected between an output of the comparator and an input of the comparator configured to receive the sense voltage.

According to several embodiments, the current source is configured to compensate the reference voltage for changes in resistance of the bond wire due to changes in temperature.

In various embodiments, the portable communications device further includes a second bond wire electrically connected in parallel with the first bond wire.

In certain embodiments, the portable communications device further includes a front end module including the power amplifier, the bond wire, the reference resistor, and the comparator.

In some embodiments, the portable communications device further includes an antenna configured to receive the amplified signal from the power amplifier.

In certain embodiments, the saturation control signal of the comparator is configured to protect the power amplifier from drawing an excessive current from the power supply due to changes in a voltage standing wave ratio (VSWR) of the antenna.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The components within the figures are not necessarily to scale, emphasis instead being placed upon clearly illustrating the principles of the invention. Moreover, in the figures, like reference numerals designate corresponding parts throughout the different views.

DETAILED DESCRIPTION OF EMBODIMENTS

Although described with particular reference to a portable transceiver, the apparatus and method for current sensing using a wire bond for can be implemented in any device that detects the power output of a power amplifier by sensing current output of the power amplifier. Further, the apparatus and method for current sensing using a wire bond can be implemented in any application in which DC or alternating current (AC) current is sensed and controlled. Although described below in a system that senses DC current and develops a corresponding DC sense voltage, for sensing and controlling AC current, a peak detector or a root mean square (rms) detector could be implemented to condition the sensed voltage for further DC processing. Further, at least portions of the circuitry to be described below can be fabricated using an integrated bipolar-field effect transistor (BIFET) process utilizing the relative lower turn-on voltage of FET transistors. Further, in particular embodiments, the transistors to be described below comprise bipolar junction transistors (referred to as a BJT), which includes heterojunction bipolar junction transistors (referred to as an HBT), and field effect transistors (referred to as a FET) that may be fabricated using what is referred to as the bipolar complementary metal oxide semiconductor (BiCMOS) process.

The apparatus and method for current sensing using a wire bond is generally implemented in hardware. However, one or more of the signals that control a power amplifier can be implemented in software, or a combination of hardware and software. When implemented in hardware, the apparatus and method for current sensing using a wire bond can be implemented using specialized hardware elements. When one or more of the control signals in the bias circuitry associated with the apparatus and method for current sensing using a wire bond are generated at least partially in software, the software portion can be used to precisely control the operating aspects of various components in a power amplifier bias circuit associated with a communications device. The software can be stored in a memory and executed by a suitable instruction execution system (microprocessor). The hardware implementation of the apparatus and method for current sensing using a wire bond can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), a separate, specially designed integrated circuit for biasing purposes, etc.

Figure 1:
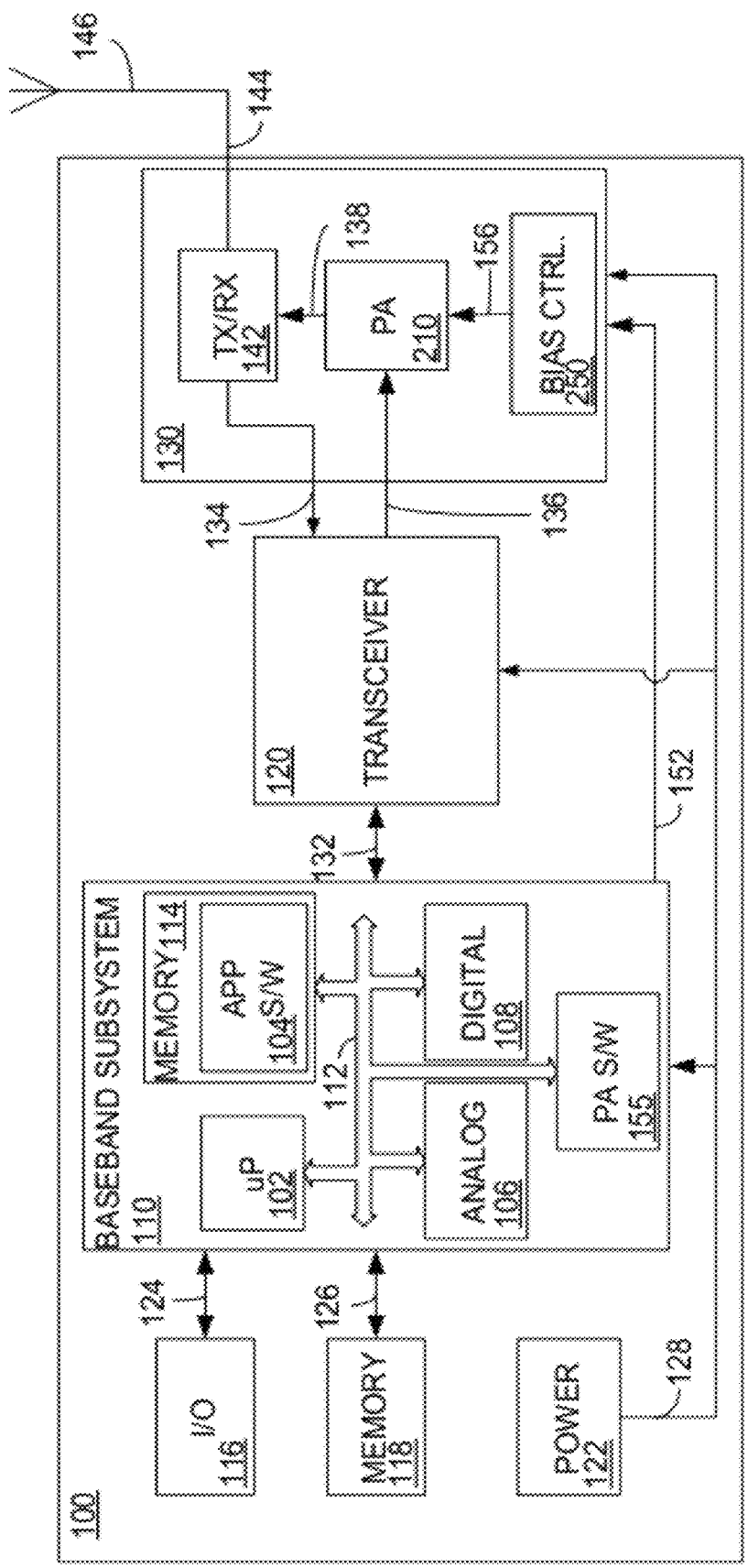
FIG. 1 is a block diagram illustrating a simplified portable communication device.

FIG. 1 is a block diagram illustrating a simplified portable communication device 100. In an embodiment, the portable communication device 100 can be a portable cellular telephone. Embodiments of the apparatus and method for current sensing using a wire bond can be implemented in any device having a power amplifier or in which it is desirable to sense an amount of current, and in this example, are implemented in a portable communication device 100. The portable communication device 100 illustrated in FIG. 1 is intended to be a simplified example of a cellular telephone and to illustrate one of many possible applications in which the apparatus and method for current sensing using a wire bond can be implemented. One having ordinary skill in the art will understand the operation of a portable cellular telephone, and, as such, implementation details are omitted. The portable communication device 100 includes a baseband subsystem 110, a transceiver 120, and a front end module (FEM) 130. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108 and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126, and a power source 122 is connected to the baseband subsystem 110, transceiver 120 and front-end module 130 over connection 128. The I/O element 116 can include, for example, a microphone, a keypad, a speaker, a pointing device, user interface control elements, and any other device or system that allows a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card, or a combination of the above-described memories.

The power source 122 can be, for example, a battery, or other rechargeable power source, or can be an adaptor that converts AC power to the correct voltage used by the portable communication device 100. In an embodiment, the power source can be a battery that provides a nominal voltage output of approximately 3.0 volts (V). However, the output voltage range of the power source can range from approximately 1.0 to 5.0 V.

The processor 102 can be any processor that executes the application software 104 to control the operation and functionality of the portable communication device 100. The memory 114 can be volatile memory, non-volatile memory, or a combination thereof, and in an embodiment, can be non-volatile memory that stores the application software 104. If portions of the control logic of the power amplifier bias circuit are implemented in software, then the baseband subsystem 110 also includes power amplifier software 155, which may cooperate with control logic that can be executed by the microprocessor 102, or by another processor, to control at least some aspects of the operation of the power amplifier bias circuit and/or the power amplifier 210 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front-end module 130 includes a transmit/receive (TX/RX) switch 142, a power amplifier 210 and a bias controller 250 mounted on a substrate such as FR-4 multi-layer printed wiring board. The front end module 130 can be a multi-chip module (MCM) that may include a number of different chips or dies that embodies the various components. For example, the power amplifier 210 may be implemented on a die fabricated using gallium arsenide (GaAs) process while the bias controller 250 may be implemented on a different die using, for example, a silicon (Si) fabrication process. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 210. The power amplifier 210 amplifies the signal for transmission. The output of the power amplifier 210 is provided over connection 138 to the TX/RX switch 142, and then to an antenna 146 over connection 144. The bias controller 250 provides a bias control signal that determines at least a portion of the operating characteristics of the power amplifier 210. In an embodiment, the bias controller 250 includes circuitry that receives a voltage that is developed across a wire bond structure that senses a current that is associated with an output of the power amplifier 210. The voltage developed across the wire bond structure is proportional to the sensed current. The voltage developed across the wire bond structure is applied to elements within the bias controller 250 to prevent the power amplifier 210 from drawing excessive and destructive current from the power supply 122, such as might occur when the power amplifier 210 is subjected to non-optimal (high VSWR) antenna load conditions.

A signal received by the antenna 146 is provided over connection 144 to the TX/RX switch 142, which provides the received signal over connection 134 to the transceiver 120.

In an embodiment, the baseband subsystem 110 provides one or more control signals to the power amplifier 210 and the bias controller over connection 152. Connection 152 can be implemented as discrete connections, or as a bus having multiple signals and may be bidirectional.

Figure 2:
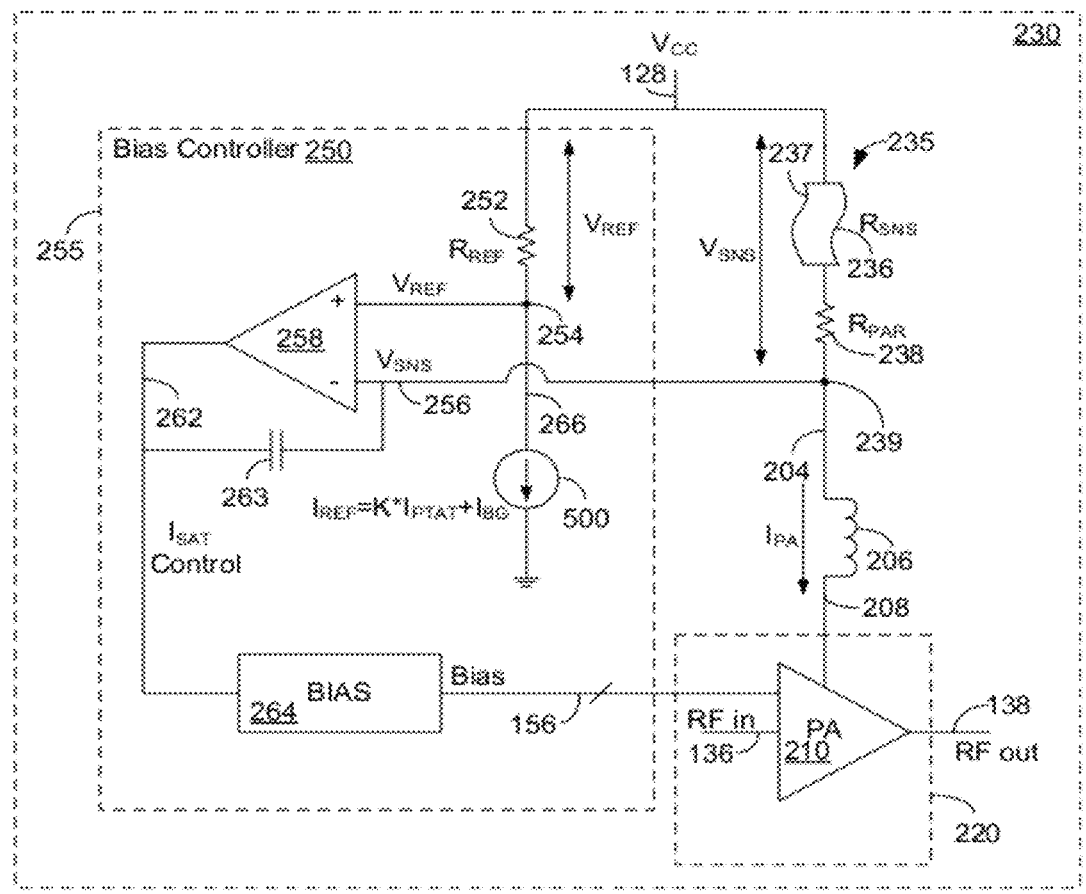
FIG. 2 is a schematic diagram illustrating an embodiment of the apparatus and method for current sensing using a wire bond.

FIG. 2 is a schematic diagram 200 illustrating an embodiment of the apparatus for current sensing using a wire bond. In the example shown in FIG. 2, the power amplifier 210 is implemented with devices fabricated in a gallium arsenide (GaAs) material system and is located on die 220, and the bias controller 250 is implemented with devices fabricated in a silicon (Si) material system and is implemented on a die 255. Although the power amplifier 210 is illustrated as a single element, the power amplifier 210 typically comprises multiple stages, which may include one or more driver stages and an output stage, as known in the art. The power amplifier die 220 and the bias controller die 255 are located on a circuit package 230. In an embodiment, the circuit package 230 can be a printed circuit board having one or more layers, as known in the art.

The circuit package 230 and the bias controller 250 receive a system voltage, $V_{cc}$, on connection 128. In an embodiment, the system voltage, $V_{cc}$, can be a DC battery voltage supplied directly by the power source 122 (FIG. 1). However, the system voltage, $V_{cc}$, can alternatively be supplied by another voltage source. In the embodiment shown in FIG. 2, the circuit package 230 contains a dual wire bond structure 235 and a resistance 238. In the embodiment shown in FIG. 2, the dual wire bond structure 235 comprises individual bond wires 236 and 237 that have a characteristic resistance, referred to as a sense resistance, $R_{SNS}$. However, a single bond wire or more than two bond wires can be implemented. The dual bond wire implementation has a higher fusing current than a single bond wire and allows for increased tuning flexibility given the mechanical form factor constraints. Tuning flexibility refers to the diameter, length and resistive characteristics of the bond wires and the response of the resistance provided by the bond wires based on their length. The resistor 238 represents a parasitic resistance ($R_{PAR}$) of the printed circuit board (PCB) that forms the underlying substrate of the circuit package 230. In a typical application, the voltage drop across the resistance, $R_{PAR}$, is significant and should be included in the sense voltage, $V_{SNS}$, that is developed across the combination of the dual wire bond structure 235 and the resistor 238. An industry-standard gold bond wire has comparable resistance and tolerance (<5%), and provides a cost effective alternative to the above-mentioned SMT resistors.

The resistance of each bond wire is directly proportional to its length. The resistance, R, is given by the round wire equation: $R=(\rho*L)/A$, where $\rho$ is the specific resistance of the wire material, L is the wire length, and A is the cross-sectional area of the wire. A diameter of a typical gold bond wire can be approximately 12 micrometers (μm) or larger, and a nominal length of each bond wire can be approximately 44 mils (1 mil=$\frac{1}{1000}$ inch), which is approximately 1118 micrometers (μm).

An inductor 206 couples the resistor 238 to a collector terminal (not shown) of the power amplifier 210 over connection 208. The inductor 206 functions as a radio frequency (RF) choke. The output of the power amplifier 210 is represented as the DC current $I_{PA}$ flowing through the inductor 206, representing the average load current of the power amplifier 210, which is provided over connection 138. In alternative power amplifier architectures, the inductor 206 may be coupled to a base terminal (not shown) of the power amplifier 210 so that base current can be monitored.

The bias controller 250 is coupled to the system voltage, $V_{cc}$, through a reference resistor, $R_{REF}$, 252. A reference voltage, $V_{REF}$, is developed across the resistor 252. The reference voltage, $V_{REF}$, is provided via node 254 to the non-inverting (+) input of a comparator 258. The comparator 258 can be implemented using an operational amplifier.

The resistor 252 is coupled over connection 266 to a current source 500. As will be described in detail below, the current source 500 provides temperature compensation and stability for the dual wire bond architecture 235 by compensating the reference voltage, $V_{REF}$, for changes in resistance of the dual wire bond structure 235 due to the temperature coefficient of the dual wire bond structure 235. The TCR of the bond wires 236 and 237 is approximately 3400 ppm, which is approximately seventeen times the TCR of an SMT resistor. To compensate for this difference in TCR between an SMT resistor and the dual wire bond structure 235, the reference voltage, $V_{REF}$, is temperature compensated by the current source 500 to track and compensate for the temperature dependent resistance characteristic of the bond wires 236 and 237. It is also important that the desired current limit threshold of the power amplifier 210 be well below the bond wire fusing current, which is the current at which the wire melts and electrically opens.

The sense voltage, $V_{SNS}$, is developed across the combination of the dual wire bond structure 235 and the resistor 238 and is provided from the node 239, over connection 256 to the inverting (−) input of the comparator 258. The output of the comparator 258 represents the difference between the reference voltage, $V_{REF}$, on node 254 and the sense voltage, $V_{SNS}$, on connection 256. The output of the comparator 258 is provided over connection 262 as a saturation control current signal, $I_{SAT}$, and is provided to a bias element 264. In the embodiment described in FIG. 2, the bias element 264 can be implemented as a current-controlled element. Alternatively, the bias element 264 can be implemented as a voltage-controlled element, in which case the signal provided on connection 262 can be a voltage signal.

The saturation control current signal on connection 262 is used to determine whether the bias element 264 reduces the bias provided to the power amplifier 210. The bias circuit 264 can be implemented in a number of ways, specific details of which are not shown for simplicity of illustration. In response to a non-zero $I_{SAT}$ current, the bias element 264 decreases the collector voltage of the driver stage of the power amplifier 210. This reduces the radio frequency (RF) drive into the final stage of the power amplifier 210 and, as a result, the final stage collector current of the power amplifier 210 decreases to the current clamp set point value determined by $V_{REF}$.

The power amplifier current, $I_{PA}$, is sensed by the sense resistance, $R_{SNS}$, of the dual wire bond structure 235 and the parasitic PCB trace resistance, $R_{PAR}$, and the resulting supply voltage referenced sense voltage, $V_{SNS}$, is applied to the inverting input of the comparator 258. The reference voltage, $V_{REF}$, is a supply referenced current limit threshold voltage developed by $I_{REF}$ and $R_{REF}$, and is applied to the non-inverting input of the comparator 258. Under nominal current conditions, the sense voltage, $V_{SNS}$, is less than the reference voltage, $V_{REF}$, and the output of the comparator 258 is zero (such that $I_{SAT}$ control=0), resulting in no modification of the power amplifier bias provided by the bias element 264. Under high current conditions, the sense voltage, $V_{SNS}$, exceeds the reference voltage, $V_{REF}$, and a continuous control loop comprising the comparator 258, the bias element 264, and the power amplifier 210 is enabled. The non-zero output of the comparator 258 is integrated over time by the capacitor 263, and causes the bias element 264 to reduce the bias provided to the power amplifier 210 to maintain the power amplifier current, $I_{PA}$, at the current limit threshold. During this locked loop condition, the output of the comparator 258 attempts to equalize the sense voltage, $V_{SNS}$, and the reference voltage, $V_{REF}$. The bias element 264 and its ability to respond to the saturation control current signal, $I_{SAT}$, or a corresponding saturation control voltage signal, if so implemented, can be implemented in a number of different ways, as known in the art.

Figure 3:
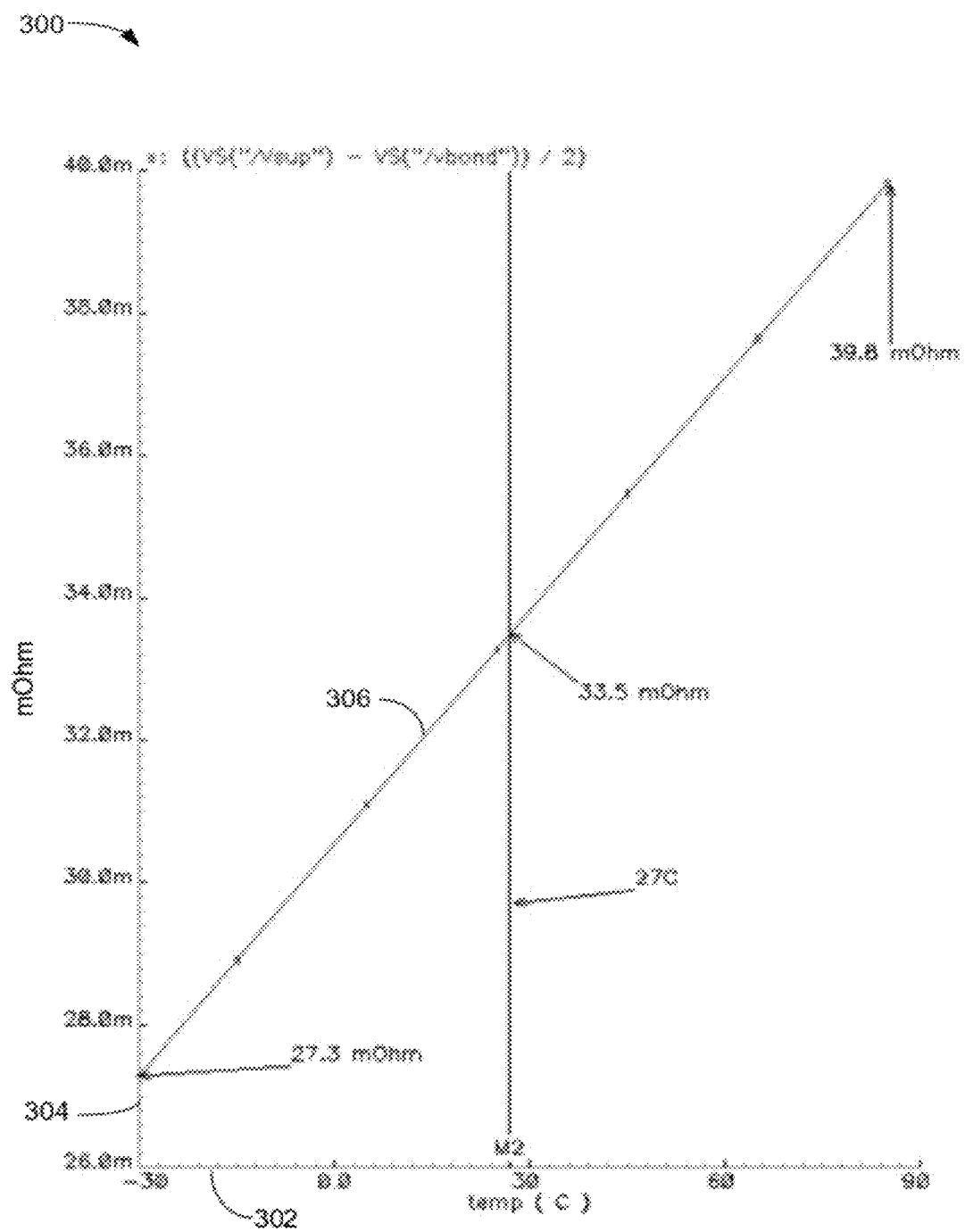
FIG. 3 is a graphical illustration showing the resistance over temperature of the dual wire bond architecture of FIG. 2.

FIG. 3 is a graphical illustration 300 showing the resistance versus temperature of the dual wire bond structure 235 of FIG. 2. The abscissa 302 represents temperature in degrees Celsius (° C.) and the ordinate 304 represents resistance in mΩ. The trace 306 represents the resistance of the combination of the bond wires 236 and 237 ($R_{SNS}$) and the parasitic resistance, $R_{PAR}$, of the resistance 238. The approximate 5 mΩ PCB trace represented by $R_{PAR}$ is approximately 15% of the total 33 mΩ combination of $R_{SNS}$ and $R_{PAR}$. To include any resistance change due to self heating, the resistance should be measured at a current that is close to the desired current limit threshold, which in an embodiment can be 2A DC.

For a given power amplifier output current $I_{PA}$, the sense voltage, $V_{SNS}$, will increase with temperature in the same manner as the resistance ($R_{SNS}+R_{PAR}$) increases with temperature. To remove this temperature variation from the differential input of the comparator 258, the reference voltage, $V_{REF}$, should have a substantially identical positive temperature dependence. To achieve this temperature cancellation, the reference current, $I_{REF}$, comprises a proportional to absolute temperature current ($I_{PTAT}$) and a fixed band gap current ($I_{BG}$). The current, $I_{PTAT}$, is multiplied by a gain factor (K) to achieve the desired slope while the fixed band gap current, $I_{BG}$, sets the desired intercept. Accordingly, $I_{REF}=K*I_{PTAT}+I_{BG}$.

Figure 4:
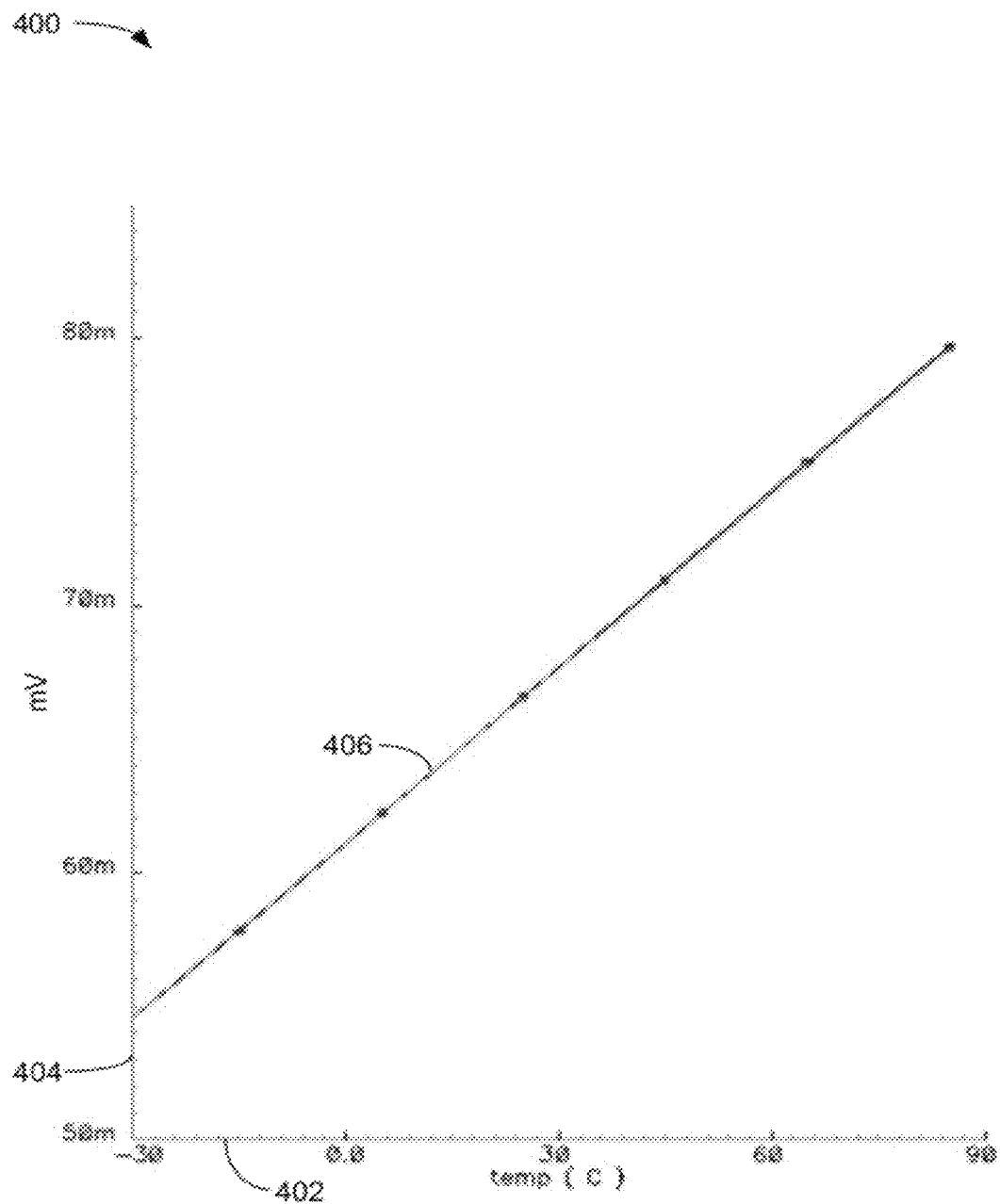
FIG. 4 is a graphical illustration showing the desired temperature tracking between $V_{SNS}$ and $V_{REF}$ after $V_{REF}$ temperature compensation.

FIG. 4 is a graphical illustration 400 showing the desired temperature tracking between $V_{SNS}$ and $V_{REF}$ after $V_{REF}$ is temperature compensated. The abscissa 402 represents temperature in degrees Celsius (° C.) and the ordinate 404 represents voltage in millivolts (mV).

The trace 406 shows the variation in mV of the sense voltage, $V_{SNS}$ and the reference voltage, $V_{REF}$, versus temperature, and illustrates the temperature insensitivity of $V_{SNS}$ and $V_{REF}$ after $V_{REF}$ temperature compensation by the current source 500. The trace 406 shows that the temperature coefficient of $V_{REF}$ is approximately identical to the temperature coefficient of $V_{SNS}$ (i.e., the bond wire) in FIG. 3, which is the desired result of the $V_{REF}$ temperature compensation. As a result of the temperature compensation provided by the reference current, $I_{REF}$, the differential input voltage ($V_{REF}$–$V_{SNS}$) provided to the comparator 258 (FIG. 2) is invariant to changes in temperature. Since $V_{REF}$ and $V_{SNS}$ are approximately aligned with respect to variation over temperature, the $V_{REF}$–$V_{SNS}$ difference voltage is approximately zero with respect to temperature. Since the comparator 258 responds only to differential input voltages, the output signal of the comparator 258 in this application is at least partially temperature invariant. The output voltage of the comparator 258 responds only to changes in the power amplifier current, $I_{P4}$.

Figure 5:
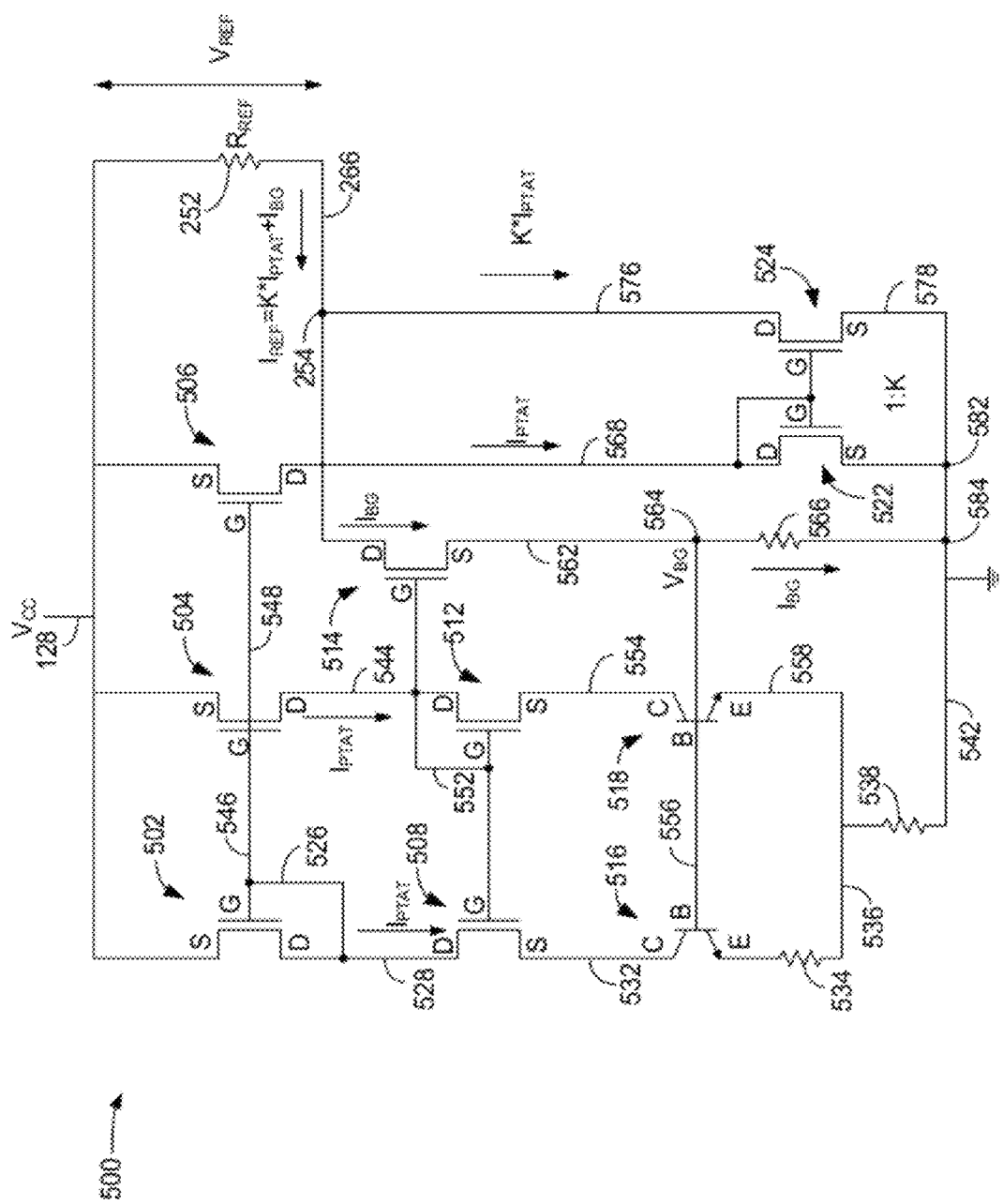
FIG. 5 is a schematic diagram showing an example of a circuit for generating a temperature compensated reference current, $I_{REF}$.

FIG. 5 is a schematic diagram showing an example of a circuit for generating a temperature compensated reference current, $I_{REF}$. The temperature compensated reference current, $I_{REF}$, allows the value of $V_{REF}$ on node 254 (FIG. 2) to be compensated for resistance changes in the dual wire bond structure 235 due to temperature variations. The circuit 500 is an example of an embodiment of the current source 500 shown in FIG. 2. The circuit 500 includes the reference resistor, $R_{REF}$, 252 coupled to the system voltage, $V_{cc}$, on connection 128. The current, $I_{REF}$ ($I_{REF}$=$K*I_{PTAT}$+$I_{BG}$), flows through the reference resistor, $R_{REF}$, 252 such that the reference voltage, $V_{REF}$, appears at node 254. In order to compensate the reference current, $I_{REF}$, for resistance changes caused by temperature fluctuations in the dual wire bond structure 235 and in the parasitic PCB resistance, $R_{PAR}$, 238, the circuit 500 includes a plurality of transistors and resistors arranged to develop a temperature compensated current.

Transistors 502, 504, and 506 can be implemented as p-type field effect transistor (PFET) devices that each have their respective source terminals coupled to the system voltage, $V_{cc}$, on connection 128. The respective gate terminal of each of the transistors 502, 504 and 506 are coupled together over connections 546 and 548. The transistor 502 has its gate and drain terminals connected together via connection 526 to form a diode, such that the transistors 504 and 506 "mirror" current flowing through transistor 502. It is understood that other transistor technologies may be used to implement the current mirror.

The transistors 508, 512, and 514 are also shown as NFET devices, but other transistor technologies may be used to implement the transistors. The drain terminal of the transistor 502 is coupled to the drain terminal of the transistor 508 such that the current, $I_{PTAT}$, flows through connection 528. The current, $I_{PTAT}$, represents a current that is proportional to absolute temperature. The source terminal of the transistor 508 is connected to a collector terminal of a bipolar junction transistor (BJT) transistor 516. The emitter terminal of the transistor 516 is connected through a resistor 534 to connection 536. The connection 536 is also coupled to an emitter terminal of a transistor 518 and is coupled through resistor 538 to system ground. The transistors 516 and 518 have their respective base terminals coupled together via connection 556. Transistor 516 is typically N times the size of transistor 518, typically implemented by paralleling N instances of transistors of the size of transistor 518.

The current flowing through the drain terminal of the transistor 504 onto connection 544 also represents the proportional to absolute temperature current, $I_{PTAT}$. The drain terminal of the transistor 504 is coupled to the drain terminal of the transistor 512. The source terminal of the transistor 512 is coupled via connection 554 to the collector terminal of the transistor 518. The emitter terminal of the transistor 518 is coupled via connection 558 and resistor 534 to the emitter terminal of the transistor 516, and is also coupled through the resistor 538 to system ground on connection 542. Transistors 502 and 504 form a current mirror such that current, $I_{PTAT}$, flows through each of the transistors 516 and 518.

The reference current, $I_{REF}$, at node 254 is also coupled to the drain terminal of the transistor 514. A band gap current, $I_{BG}$, flows through the transistor 514 onto connection 562 such that a band gap voltage, $V_{BG}$, appears across a resistor 566 at node 564. The band gap voltage, $V_{BG}$, at node 564 is connected to the respective base terminals of the transistors 516 and 518. The band gap voltage, $V_{BG}$, is used to bias the transistors 516 and 518. The band gap current, $I_{BG}$, flows through resistor 566 to a ground node 584.

The transistor 506 allows the current $I_{PTAT}$ to flow through connection 568 to the drain terminal of a transistor 522. The transistor 522 is configured as a diode. The transistor 522 is arranged with a transistor 524 to form a current mirror having a proportion 1:K, where K is the gain factor. The respective source terminals of the transistors 522 and 524 are connected to node 582. The drain terminal of the transistor 524 is connected to the reference voltage, $V_{REF}$, at node 254 such that a current, $K*I_{PTAT}$, flows through the transistor 524. The current, $K*I_{PTAT}$ is the current $I_{PTAT}$ multiplied by the gain factor K. The gain factor K refers to the ratio of the width and length of the transistor 524 to the respective width and length of the transistor 522.

In this manner, the reference current, $I_{REF}$, flowing through the reference resistor, $R_{REF}$, 252 (FIG. 2) is a temperature compensated current that allows the reference voltage, $V_{REF}$, at connection 254 (FIG. 2) to accurately track and compensate for changes in resistance of the wire bond structure due to a temperature coefficient of the wire bond structure and any temperature variations of the parasitic resistance 238 shown in FIG. 2.

The process and temperature variation of the reference resistor, RREF, 252 is cancelled by the like resistive component (R) in Iptat=Vt*K1/R and Ibg=Vbg/R, where K1 represents the natural logarithm of the ratio of the area, (Ln(A)), of the transistor 516 to the area of the transistor 518, (K1=Ln(A)=Ln (area of transistor 516/area of transistor 518), Vt is the thermal voltage and Vbg is the bandgap voltage.

Figure 6:
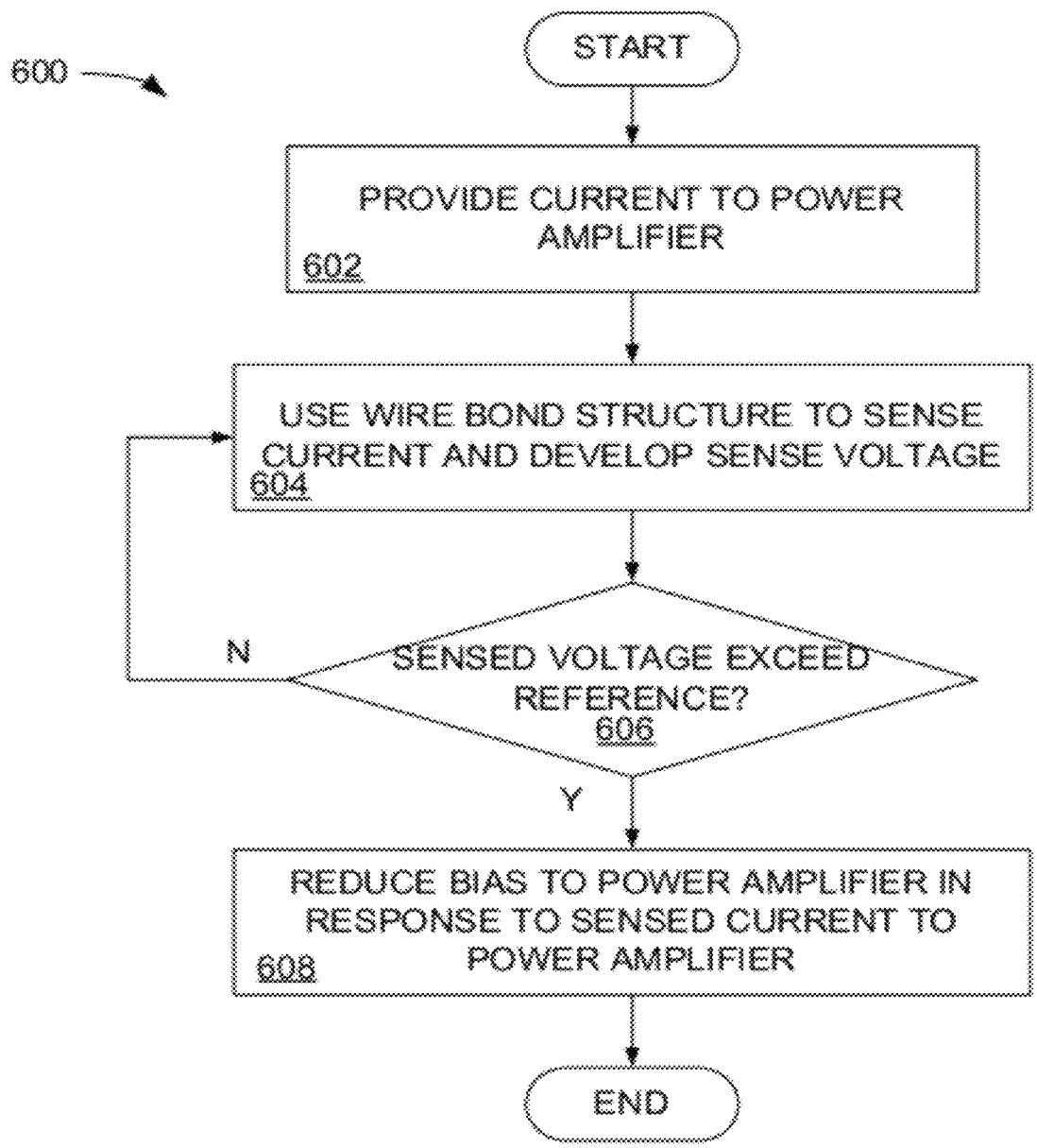
FIG. 6 is a flow chart describing the operation of an embodiment of a method for current sensing using a wire bond.

FIG. 6 is a flow chart describing the operation of an embodiment of a method for current sensing using a wire bond. In block 602, a current is provided to a power amplifier. In block 604, the dual wire bond structure 235 is used to sense the current being provided to the power amplifier and develop a sense voltage, $V_{SNS}$. In block 606 it is determined whether the sense voltage, $V_{SNS}$, exceed a reference voltage, $V_{REF}$. If the sense voltage, $V_{SNS}$, does not exceed the reference voltage, $V_{REF}$, the process returns to block 604 where the dual wire bond structure 235 continues to sense the current being provided to the power amplifier and develop the sense voltage, $V_{SNS}$. If, in block 606, it is determined that the sense voltage, $V_{SNS}$, exceeds the reference voltage, $V_{REF}$, then, in block 608, the bias provided to the power amplifier is reduced to prevent the power amplifier from drawing an excessive amount of current.

While various embodiments of the invention have been described, it will be apparent to those of ordinary skill in the art that many more embodiments and implementations are possible that are within the scope of this invention.

What is claimed is:

1. A packaged circuit comprising:
a power amplifier configured to amplify a radio frequency (RF) signal;

a first bond wire electrically connected between a system voltage source and a supply input of the power amplifier;
a current source;
a reference resistor electrically connected between the system voltage source and the current source; and
a comparator configured to compare a sense voltage that is based on a voltage across the first bond wire to a reference voltage that is based on a voltage across the reference resistor, the comparator configured to generate a saturation control signal for clamping a bias current of the power amplifier when the sense voltage exceeds the reference voltage.

2. The packaged circuit of claim 1 further comprising a first die including the comparator.

3. The packaged circuit of claim 2 wherein the first die further includes a bias circuit configured to generate the bias current of the power amplifier, the bias circuit configured to clamp a supply current flowing through the power amplifier at a current limit threshold when the saturation control signal indicates that the sense voltage exceeds the reference voltage.

4. The packaged circuit of claim 3 wherein the first die further includes a capacitor electrically connected between an output of the comparator and an input of the comparator configured to receive the sense voltage.

5. The packaged circuit of claim 4 wherein the first die further includes the reference resistor and the current source.

6. The packaged circuit of claim 5 wherein the current source is configured to compensate the reference voltage for changes in resistance of the first bond wire due to changes in temperature.

7. The packaged circuit of claim 2 further comprising a second die including the power amplifier.

8. The packaged circuit of claim 7 wherein the first die is implemented using a silicon (Si) process and the second die is implemented using a gallium arsenide (GaAs) process.

9. The packaged circuit of claim 7 further comprising a printed circuit board (PCB), the first and second dies disposed on the PCB.

10. The packaged circuit of claim 9 wherein the bond wire is electrically connected between a first connection of the PCB configured to receive the system voltage source and a second connection of the PCB.

11. The packaged circuit of claim 10 further comprising a choke inductor electrically connected between the second connection of the PCB and the supply input of the power amplifier.

12. The packaged circuit of claim 1 further a second bond wire electrically connected in parallel with the first bond wire.

13. A portable communications device comprising:
a transceiver;
a power amplifier configured to amplify a signal generated from the transceiver;
a power supply configured to generate a system voltage source;
a bond wire electrically connected between the system voltage source and a supply input of the power amplifier;
a current source;
a reference resistor electrically connected between the system voltage source and the current source; and
a comparator configured to compare a sense voltage that is based on a voltage across the bond wire to a reference voltage that is based on a voltage across the reference resistor, the comparator configured to generate a saturation control signal for clamping a bias current of the power amplifier when the sense voltage exceeds the reference voltage.

14. The portable communications device of claim 13 further comprising a bias circuit configured to generate the bias current of the power amplifier, the bias circuit configured to clamp a supply current flowing through the power amplifier at a current limit threshold when the saturation control signal indicates that the sense voltage exceeds the reference voltage.

15. The portable communications device of claim 14 further comprising a capacitor electrically connected between an output of the comparator and an input of the comparator configured to receive the sense voltage.

16. The portable communications device of claim 13 wherein the current source is configured to compensate the reference voltage for changes in resistance of the bond wire due to changes in temperature.

17. The portable communications device of claim 13 further comprising a second bond wire electrically connected in parallel with the first bond wire.

18. The portable communications device of claim 13 further comprising a front end module including the power amplifier, the bond wire, the reference resistor, and the comparator.

19. The portable communications device of claim 13 further comprising an antenna configured to receive the amplified signal from the power amplifier.

20. The portable communications device of claim 19 wherein the saturation control signal of the comparator is configured to protect the power amplifier from drawing an excessive current from the power supply due to changes in a voltage standing wave ratio (VSWR) of the antenna.

* * * * *